United States Patent
Farkas et al.

(10) Patent No.: US 12,292,804 B2
(45) Date of Patent: May 6, 2025

(54) ON-DIE CHANNEL IMPEDANCE VERIFICATION

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 177 days.

(21) Appl. No.: 18/319,274

(22) Filed: May 17, 2023

(65) Prior Publication Data

US 2024/0385231 A1   Nov. 21, 2024

(51) Int. Cl.
| | |
|---|---|
| G06F 11/00 | (2006.01) |
| G01R 27/16 | (2006.01) |
| G06F 11/07 | (2006.01) |
| G06F 11/16 | (2006.01) |
| G06F 11/27 | (2006.01) |

(52) U.S. Cl.
CPC .......... *G06F 11/1616* (2013.01); *G01R 27/16* (2013.01); *G06F 11/0745* (2013.01); *G06F 11/27* (2013.01)

(58) Field of Classification Search
CPC .. G06F 11/27; G06F 11/0745; G06F 11/0754; G06F 11/1608; G06F 11/1616; G06F 11/3051; G06R 27/16
See application file for complete search history.

(56) References Cited

U.S. PATENT DOCUMENTS

| | | | |
|---|---|---|---|
| 5,134,311 A * | 7/1992 | Biber | H04B 3/00 326/82 |
| 9,893,761 B2 | 2/2018 | Ye et al. | |
| 2006/0097749 A1* | 5/2006 | Ahmad | H03K 19/0005 326/30 |
| 2008/0266021 A1* | 10/2008 | Van Bezooijen | H04B 1/0458 333/32 |
| 2010/0073037 A1* | 3/2010 | Kumath | H03K 19/00384 327/108 |
| 2013/0076436 A1* | 3/2013 | Chiaburu | H04L 25/0278 330/105 |
| 2018/0007782 A1 | 1/2018 | Zhang et al. | |
| 2022/0255505 A1* | 8/2022 | Huang | H03F 3/45475 |
| 2022/0295628 A1* | 9/2022 | Farkas | H01P 5/028 |

* cited by examiner

*Primary Examiner* — Joseph D Manoskey
(74) *Attorney, Agent, or Firm* — Larson Newman, LLP

(57) ABSTRACT

A processing device includes a transmitter, a difference amplifier, and a data detector. A first output buffer of the transmitter receives data and has a first output coupled to a channel that is designed to have a first impedance value, but that has a second impedance value that which may or may not be equal to the first impedance value. A second output buffer of the transmitter receives the data and has an output coupled to a circuit that has the first impedance. The difference amplifier has inputs coupled to the outputs of the first and second output buffers. The data detector is coupled to an output of the difference amplifier. The data processing device operates in a test operation mode to provide test data to the first and second output buffers and to determine whether the second impedance is equal to the first impedance based on information from the data detector.

20 Claims, 3 Drawing Sheets

ON-DIE CHANNEL IMPEDANCE VERIFICATION

FIELD OF THE DISCLOSURE

This disclosure generally relates to information handling systems, and more particularly relates to on-die channel impedance verification.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A processing device may include a transmitter, a difference amplifier, and a data detector. A first output buffer of the transmitter may receive data and may have a first output coupled to a channel that is designed to have a first impedance value, but that has a second impedance value that which may or may not be equal to the first impedance value. A second output buffer of the transmitter may receive the data and may have an output coupled to a circuit that has the first impedance. The difference amplifier may have inputs coupled to the outputs of the first and second output buffers. The data detector may be coupled to an output of the difference amplifier. The data processing device may operate in a test operation mode to provide test data to the first and second output buffers and to determine whether the second impedance is equal to the first impedance based on information from the data detector.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
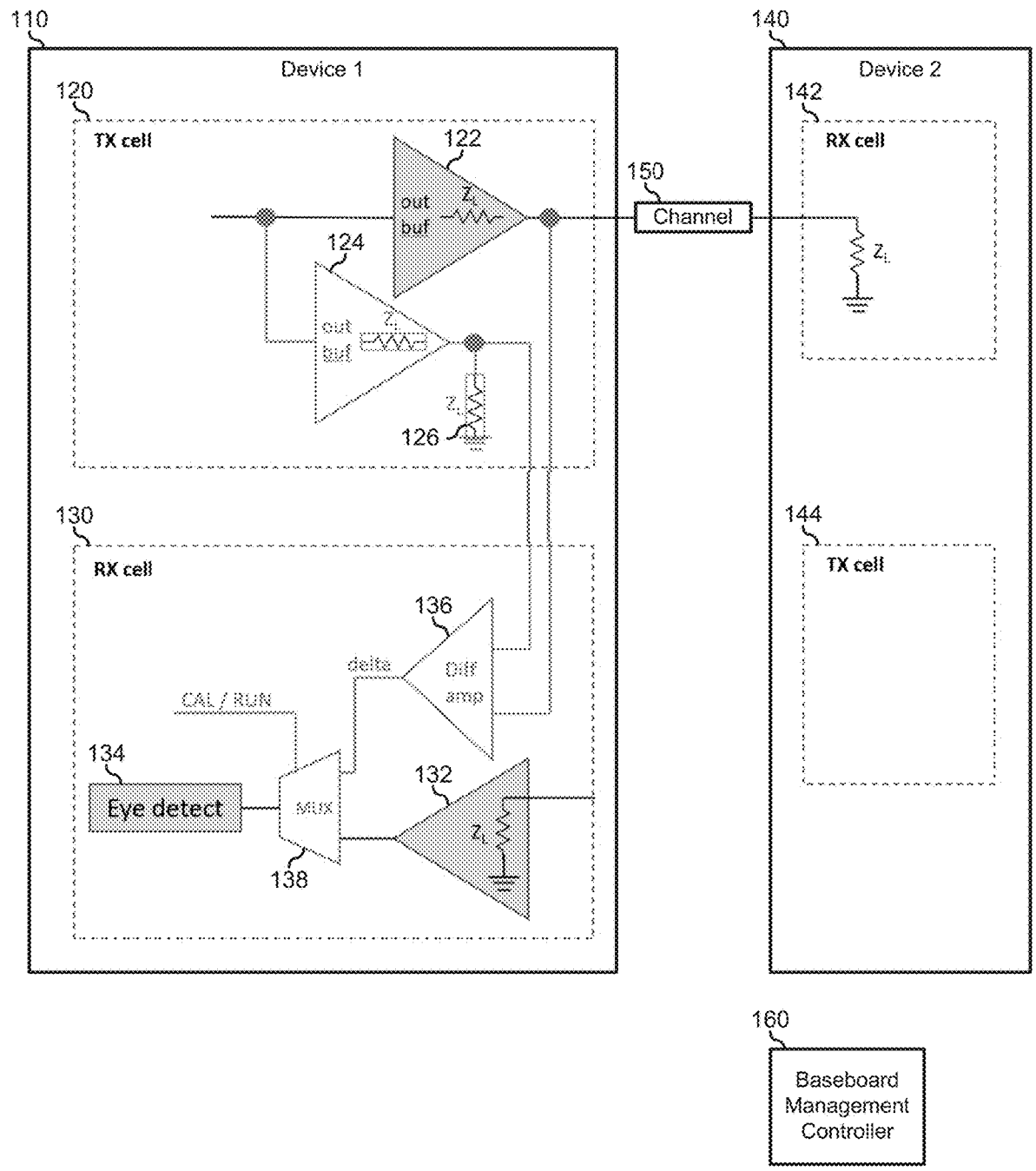
FIG. 1 is a block diagram illustrating an information handling according to an embodiment of the current disclosure.

FIG. 1 illustrates an information handling system 100 including a first device (Device 1) 110, a second device (Device 2) 120, and a baseboard management controller 160. Device 110 and device 140 are characterized as being in communication with each other via one or more high-speed serial data communication link. As such, device 110 includes a transmitter 120 and a receiver 130, and device 140 includes a receiver 142 and a transmitter 144. Transmitter 120 is configured to transmit serialized data to receiver 142 via a channel 150, and transmitter 144 is configured to transmit serialized data to receiver 130 via another channel (not illustrated). As shown and described herein, the functions and features of transmitter 120 are representative of the functions and features of transmitter 144, and the functions and features of receiver are representative of the functions and features of receiver 142. However, the illustration of FIG. 1 and the following description are provided with reference primarily to device 110 for simplicity, and the functions and features as described herein with reference to device 110 are likewise ascribed to device 140. That is, a system and method for verification of a channel impedance of channel 150 is described herein, but the teachings herein are applicable for the verification of the channel between transmitter 144 and receiver 130 (not illustrated).

In normal operation, transmitter 120 operates to receive serialized data at the input of an output buffer 122, and the serialized data is transmitted via channel 150 to receiver 142 that operates to detect the serialized data. In this regard, output buffer 122 is typically terminated with a characteristic impedance (for example 50 ohms ($\Omega$), 90 $\Omega$, 100 $\Omega$, or another impedance) that is equal to the impedance of channel 150 and a termination impedance of receiver 142, and a voltage signal at the output of the output buffer is characterized as a voltage divider circuit of equal impedances. That is, the voltage at the input to channel 150 will be one half ($\frac{1}{2}$) of a source voltage for output buffer 122. Receiver 142 includes a terminated receive buffer and a data detector to recover the serialized data from transmitter 120.

Receiver 130 includes a terminated receive buffer 132, a data detector 134, a difference amplifier 136, and a multiplexor 138. In normal operation, receive buffer 132 is connected to a channel similar to channel 140 and receives serialized data from transmitter 144, and the serialized data is recovered by data detector 134. In particular, the output of receive buffer 132 is connected to a first input of multiplexor 138, and the output of the multiplexor is connected to data detector 134. A selector input to multiplexor 138 selects the first input in a runtime state for normal operation, and selects a second input in a test state as described below.

It has been understood by the inventors of the current disclosure that poor impedance matching between a transmitter, a receiver, and the associated channel may result in poor signal transmission quality, especially as the speed of high-speed serial data communication interfaces increases. However because the termination resistors in the transmitter and the receiver are typically implemented in the circuits of the respective devices, that is, on-die, the impedance of the termination resistors are typically maintained within tight tolerances. However, the associated channels are typically implemented on a printed circuit board (PCB). Such channels are often difficult to design within the desired impedance tolerance due to various trace routing conditions, such as trace length mismatch, poor ground plane coupling, signal reflections at various interfaces that present open circuit stubs, or the like. Moreover, even when a particular channel is designed to within the desired impedance tolerance, variations in PCB manufacturing can lead to poor channel impedance. Such variations may include inconsistent metal or dielectric layer thicknesses, feature misalignments between layers of the PCB, misaligned via back-drilling, fiber weave effects, or the like.

The current disclosure provides a system and methods of user thereof for the on-die measurement of channel impedances. Such measurements may be taken during a system quality check to determine whether or not a particular information handling system passes a system quality threshold, and the results of channel impedance verification for multiple information handling systems may be utilized to identify quality trends or specific channel design issues. Such measurements may also be taken in deployed systems to monitor system health and to identify potential reliability issues in the deployed systems, as needed or desired. Finally, such measurements during system quality checks or within deployed systems may be utilized in conjunction with system management features of the information handling system to direct the receiver to adjust the termination resistances within the receiver or the transmitter.

In a particular embodiment, circuitry is provided on the die of device 110 to measure the impedance of channel 150, and to raise a warning or to adjust the termination resistance value of receiver 142 or of transmitter 120. As such, transmitter 122 includes a test circuit that includes a test output buffer 124 and a termination resistor 126. The input of test output buffer 124 is connected to receive the serialized data. Test output buffer 124 is internally terminated with a resistance of the same value as internal termination of output buffer 122, and the output of the test output buffer is terminated with termination resistor 126, which has the same value as the termination resistor in receiver 142. In this way, the output of test output buffer 124 is configured to simulate an ideal channel. For example if channel 150 is intended to be a 50 Ω channel, then the output of test output buffer 124 will also present a 50 Ω output. Note here that the output impedances of output buffer 122 and test output buffer 124, and the input impedances of receiver 142 and receive buffer 132 will be understood to be substantially equal to the characteristic impedance of channel 150.

The output of output buffer 122 is provided to a first input of difference amplifier 136, and the output of test output buffer 124 is provided to a second input of the difference amplifier. The output of difference amplifier 136 is provided to the second input of multiplexor 138. The selector input to multiplexor 138 selects the second input in a test/calibration state. Difference amplifier 136 operates to determine a delta between the real output of transmitter 120, as provided by output buffer 122, and the ideal output of the transmitter, as provided by test output buffer 124. In a particular embodiment, the output of output buffer 122 is provided to a summing input (positive input) of difference amplifier 136 and the output of test output buffer 124 is provided to a difference input (negative input) of the difference amplifier. In another embodiment, the output of output buffer 122 is provided to the difference input (negative input) of difference amplifier 136 and the output of test output buffer 124 is provided to the summing input (positive input) of the difference amplifier.

During runtime operation, the selector input to multiplexor 128 is set to select the first input of the multiplexor, thereby directing the output of input buffer 132 to data detector 134. During a test/calibration operation, the selector input to multiplexor 128 is set to select the second input, thereby directing the output of difference amplifier 136 to data detector 134. The input impedance of a lossy transmission line, such as channel 150, is:

$$Zin=Z0*(ZL+ZO \tan h\gamma l)/(ZL+ZO \tan h\gamma l) \quad \text{Equation 1;}$$

where Zin is the input impedance, ZL is the load impedance, ZO is the characteristic impedance of the channel, γ is the propagation constant, and (is the electrical length of the channel. However for long, lossy channels Equation 1 will be dominated by characteristic impedance ZO.

Thus the voltage on the output of output buffer 122 is a function of the channel impedance ZO, and when the impedances of the output buffer, of channel 150, and of receiver 142 are not matched from end to end, there will be measurable reflections at the output. Difference amplifier 136 thus compares the ideal output signal from test output buffer 124 at the intended channel impedance with the input of channel 150, which includes any reflections due to channel mismatch, and the output of the difference amplifier is thus equal to the reflections from the channel mismatch. This channel mismatch is then detected by data detector 134 and evaluated as described below.

During runtime operation, test output buffer 124 and difference amplifier 136 can be powered off to reduce power consumption in device 110. The placements of test output buffer 124, and of difference amplifier 136 and multiplexor 138, are shown in transmitter 120 and in receiver 130, respectively, but this is not necessarily so, and the output buffer, the difference amplifier, and the multiplexor may be located in any suitable location within device 110, as needed or desired.

Figure 2:
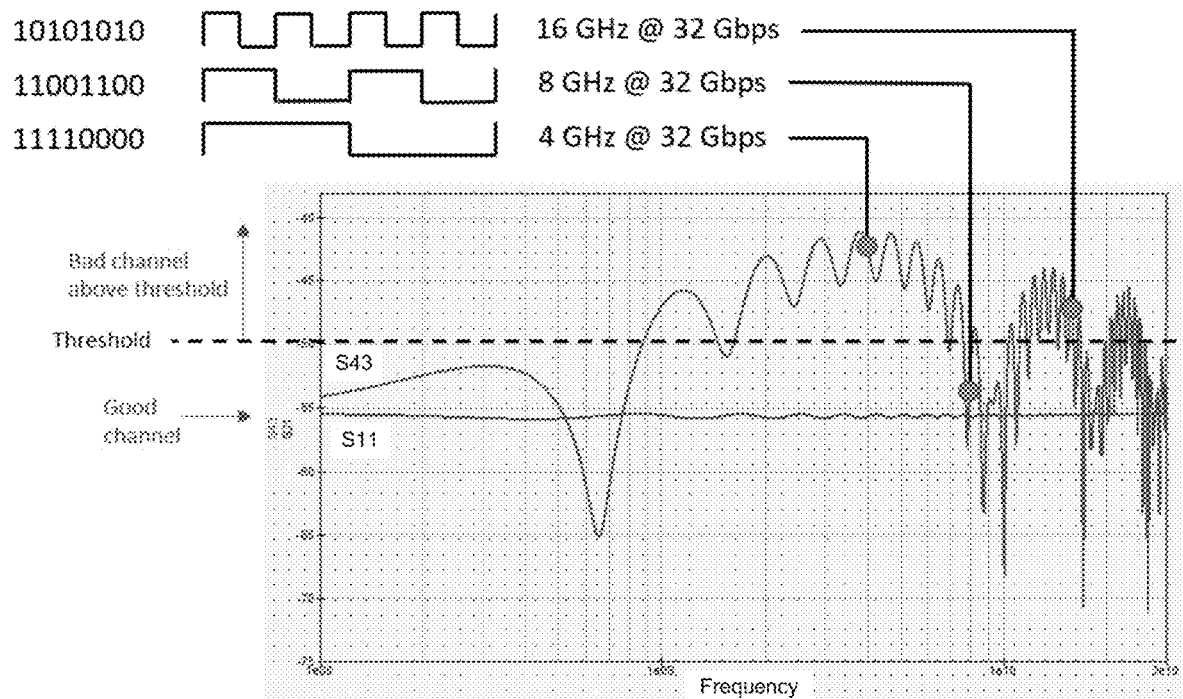
FIGS. 2 and 3 illustrate various embodiments of test data provided on the information handling system of FIG. 1.

During the test/calibration operation, a predetermined sequence of data is provided to the inputs of output buffer 122 and test output buffer 124. For example, alternating sequences of various numbers data zeros (0) and data ones (1) can be provided to simulate different frequencies. For example, FIG. 2 illustrates a case where the serial data communication interface operates at 32 gigabits per second (gbps), and where test sequences are provided to simulate a 16 gigaHertz (GHz) input, an 8 GHz input, and a 4 GHz input. In particular, by providing a test sequence of alternating zeros (0) and ones (1) (such as "10101010"), a 16 GHz signal is simulated, by providing a test sequence of alternating pairs of zeros (0) and pairs of ones (1) (such as "11001100"), an 8 GHz signal is simulated, and by providing a test sequence of alternating quads of zeros (0) and quads of ones (1) (such as "11110000"), a 4 GHz signal is simulated.

The graph 200 shows a "good channel" (that is, the S11 signal) and the level of reflections in channel 150 at a sweep of frequencies (that is, the S43 signal). Graph 200 further shows a threshold above which the level of the reflections is deemed to be unacceptable. The 16 GHz, 8 GHZ, and 4 GHz operations are highlighted, but other frequencies as depicted in graph 200 may be simulated by providing test sequences to simulate the other frequencies. The greater a higher number of frequencies tested will yield a more complete picture of the channel impedance. There are wide frequency ranges where the reflections exceed the threshold, indicating poor channel impedance. On the other hand, a channel with a good impedance match will exhibit reflections that are within the threshold over similarly wide frequency ranges. An example of an impedance match threshold may include a 10% impedance threshold, or another threshold, as needed or desired.

Figure 3:
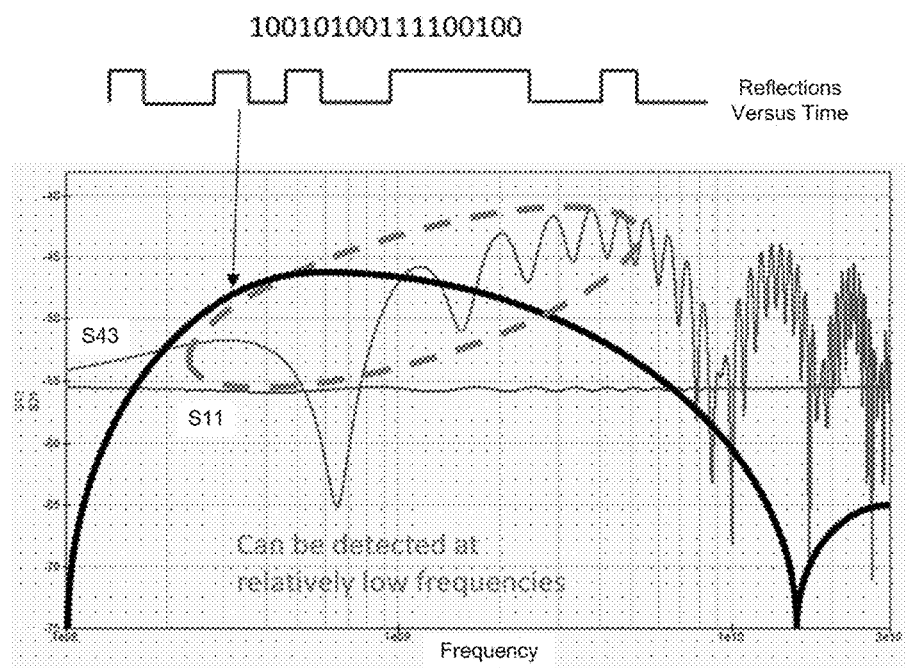

FIG. 3 illustrates an embodiment where the test sequence includes a pseudo-random bit pattern to generate broad band signal. The dark trace is a measurement of the reflection versus time. In this case, the maximum amplitude is recorded and can be correlated with the frequency that was being simulated at the particular time of the maximum amplitude. In another case, not illustrated, the test sequence may be provided as a step function (that is, a single zero (0) to one (1) transition or a single one (1) to zero (0) transition. The output of data detector 134 may be provided for post process test signal processing, such as various digital signal processing techniques as may be known in the art, to determine a reflected signal wave form. In this case, not only a "pass/no pass" evaluation may be performed on channel 150, but also, problems with the channel may be isolated to a particular location along the length of the channel, as needed or desired.

Returning to FIG. 1, in a particular embodiment, the results from the test/calibration operations are provided to BMC 160 for monitoring, managing, and maintaining the health of channel 150. In particular, during a system quality check, for example, during a manufacturing process for information handling system 100, when channel 150 fails to meet the particular quality threshold, information related the failure may be provided to BMC 160, and the BMC operates to adjust the termination resistance for the channel within transmitter 120 or receiver 142. This process can be performed iteratively to determine whether or not the impedance of channel 150 can be brought to within the quality threshold by termination resistance adjustments. If so, the termination resistance is recorded for use during run time operation of information handling system 100. If not, information handling system 100 may be deemed to have failed the quality test and the information handling system may be rejected. Other actions in response to a failure of channel 150 to meet the impedance threshold may include preventing information handling system 100 from booting to avoid data errors or data loss, determining to operate the data transmission interface at a lower frequency, or the like.

In a particular embodiment, an information handling system similar to information handling system 100 includes a device similar to device 110. The device includes a transmitter similar to transmitter 110 connected to a channel similar to channel 150. The receiver includes an output buffer similar to output buffer 122, a test output buffer similar to test output buffer 124, and a resistor similar to resistor 126. The device further includes a difference amplifier similar to difference amplifier 136 and an eye detector similar to data detector 134. However, in this embodiment, the difference amplifier and the eye detector are not specifically associated with a receiver of the device, but are separately instantiated on the die of the device. In a particular case, a single test output buffer/resister circuit may be provided for multiple channels. The single test output buffer/resister circuit output is provided to a first input of the difference amplifier, and the outputs from the various output buffers are selectably provided to through a multiplexor to the other input of the difference amplifier. Then the output of the difference amplifier is provided to the data detector. In this way, only one test circuit (that is, the test output buffer/resistor circuit), one difference amplifier, and one additional data detector need to be instantiated on the die of the device, and multiple channels can be tested by variously selecting the outputs from the multiple output buffers through the single multiplexor.

Figure 4:
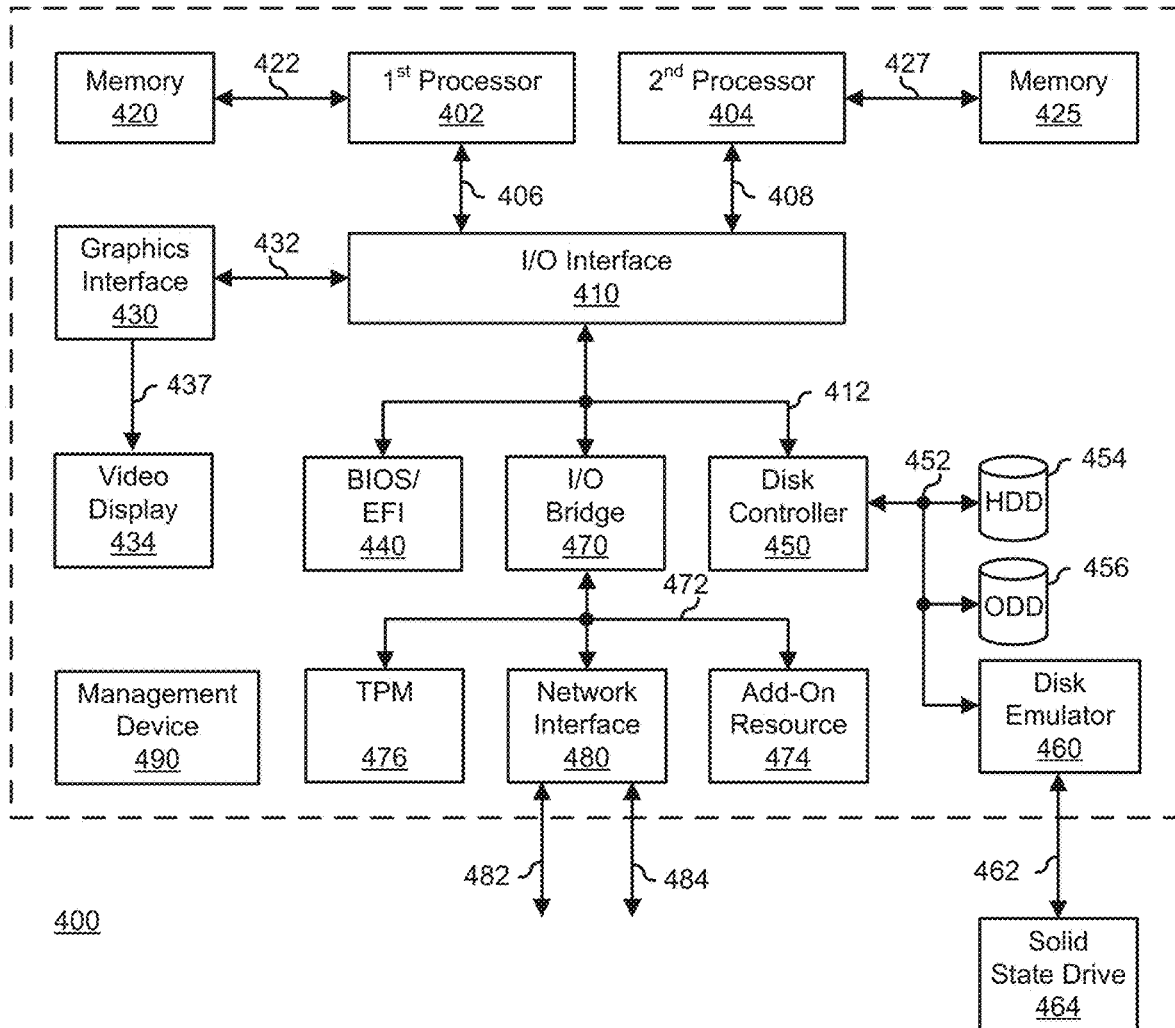
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data processing device, comprising:
   a transmitter of a high-speed data communication interface, the transmitter configured to provide data to another device via a channel, the channel being designed to have a first impedance value, but having a second impedance value that may or may not be equal to the first impedance value, the transmitter having a first output buffer configured to receive the data and having an output coupled to the channel, and a second output buffer configured to receive the data and having an output coupled to a circuit that has the first impedance;
   a difference amplifier having a first input coupled to the output of the first output buffer, a second input coupled to the output of the second output buffer, and an output; and
   a data detector having an input coupled to the output of the difference amplifier;
   wherein the data processing device is configured, in a test operation mode, to provide test data to the first and second output buffers and to determine whether the second impedance is equal to the first impedance based on information from the data detector.

2. The data processing device of claim 1, wherein the test data includes alternating sequences of data zeros (0) and data ones (1) to synthesize various frequency signals on the outputs of the first and second output buffers.

3. The data processing device of claim 1, wherein the test data includes a pseudo-random sequence of data zeros (0) and data ones (1) to synthesize pseudo-random frequency signals on the outputs of the first and second output buffers.

4. The data processing device of claim 1, wherein the test data includes a single transition from a first data state to a second data state to synthesize step function signals on the outputs of the first and second output buffers.

5. The data processing device of claim 1, wherein the data detector detects an amplitude of a difference between the output of the first output buffer and the second output buffer.

6. The data processing device of claim 5, wherein, in response to determining that the second impedance is not equal to the first impedance, the data processing device is further configured to determine that the second impedance is different from the first impedance by greater than a threshold.

7. The data processing device of claim 6, wherein, in response to determining that the second impedance is different from the first impedance by greater than a threshold, the data processing device is further configured to provide an indication that the channel is a failing channel.

8. The data processing device of claim 1, further comprising:
   a receiver of the high-speed serial data communication interface, the receiver configured to receive second data from the other device, the receiver having an input buffer configured to receive the second data and having an output; and
   a multiplexor having a first input coupled to the output of the difference amplifier, a second input coupled to the output of the input buffer, and an output coupled to the input of the data detector.

9. The data processing device of claim 8, wherein, in a runtime operation, the first input of the multiplexor is selected, and in the test operation, the second input of the multiplexor is selected.

10. The data processing device of claim 1, wherein the circuit includes a load resistor configured to provide the first impedance.

11. A method, comprising:
    providing a transmitter of a high-speed serial data communication interface on a first device, the transmitter having a first output buffer configured to receive data and having an output;
    coupling the output of the first output buffer to a channel, the channel being designed to have a first impedance value, but having a second impedance value that may or may not be equal to the first impedance value;
    providing a second output buffer configured to receive the data and having an output coupled to a circuit that has the first impedance;
    providing a difference amplifier having a first input coupled to the output of the first output buffer, a second input coupled to the output of the second output buffer;
    coupling an input of a data detector to an output of the difference amplifier;
    providing, in a test operation mode, test data to the first and second output buffers; and
    determining whether the second impedance is equal to the first impedance based on information from the data detector.

12. The method of claim 11, wherein the test data includes alternating sequences of data zeros (0) and data ones (1) to synthesize various frequency signals on the outputs of the first and second output buffers.

13. The method of claim 11, wherein the test data includes a pseudo-random sequence of data zeros (0) and data ones (1) to synthesize pseudo-random frequency signals on the outputs of the first and second output buffers.

14. The method of claim 11, wherein the test data includes a single transition from a first data state to a second data state to synthesize step function signals on the outputs of the first and second output buffers.

15. The method of claim 11, further comprising:
    detecting, by the data detector, an amplitude of a difference between the output of the first output buffer and the second output buffer.

16. The method of claim 15, wherein, in response to determining that the second impedance is not equal to the first impedance, the method further comprises:
    determining that the second impedance is different from the first impedance by greater than a threshold.

17. The method of claim 16, wherein, in response to determining that the second impedance is different from the first impedance by greater than a threshold, the method further comprises:
    providing an indication that the channel is a failing channel.

18. The method of claim 11, further comprising:
providing a receiver of the high-speed serial data communication interface, the receiver configured to receive second data from the other device, the receiver having an input buffer configured to receive the second data and having an output; and
providing a multiplexor having a first input coupled to the output of the difference amplifier, a second input coupled to the output of the input buffer, and an output coupled to the input of the data detector.

19. The method of claim 18, wherein, in a runtime operation, the first input of the multiplexor is selected, and in the test operation, the second input of the multiplexor is selected.

20. An information handling system, comprising:
a receiver of a high-speed data communication interface;
a channel coupled to the receiver, the channel being designed to have a first impedance value, but having a second impedance value that may or may not be equal to the first impedance value; and
a transmitter of the high-speed data communication interface, the transmitter configured to provide data to the receiver via the channel, the transmitter having:
a first output buffer configured to receive the data and having an output coupled to the channel;
a second output buffer configured to receive the data and having an output coupled to a circuit that has the first impedance;
a difference amplifier having a first input coupled to the output of the first output buffer, a second input coupled to the output of the second output buffer, and an output; and
a data detector having an input coupled to the output of the difference amplifier;
wherein the transmitter is configured, in a test operation mode, to provide test data to the first and second output buffers and to determine whether the second impedance is equal to the first impedance based on information from the data detector.

* * * * *